(12) United States Patent
Ryu

(10) Patent No.: US 11,073,567 B2
(45) Date of Patent: Jul. 27, 2021

(54) VEHICLE BATTERY DIAGNOSIS METHOD AND APPARATUS

(71) Applicants: Hyundai Motor Company, Seoul (KR); Kia Motors Corporation, Seoul (KR)

(72) Inventor: Ki Seon Ryu, Seoul (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 82 days.

(21) Appl. No.: 16/407,271

(22) Filed: May 9, 2019

(65) Prior Publication Data
US 2020/0110136 A1   Apr. 9, 2020

(30) Foreign Application Priority Data

Oct. 8, 2018   (KR) .......................... 10-2018-0119835

(51) Int. Cl.
| | |
|---|---|
| *G01R 31/392* | (2019.01) |
| *G01R 31/3842* | (2019.01) |
| *G01R 31/396* | (2019.01) |
| *G01R 31/36* | (2020.01) |
| *B60L 58/16* | (2019.01) |

(Continued)

(52) U.S. Cl.
CPC ............ G01R 31/392 (2019.01); B60L 58/12 (2019.02); B60L 58/16 (2019.02); G01R 31/3644 (2013.01); G01R 31/3842 (2019.01); G01R 31/396 (2019.01); H01M 10/4207 (2013.01); H02J 7/007 (2013.01); H02J 7/0021 (2013.01)

(58) Field of Classification Search
CPC .............. G01R 31/392; G01R 31/3842; G01R 31/396; G01R 31/3644; G01R 31/387; G01R 31/389; B60L 58/16; B60L 58/12; H02J 7/007; H02J 7/0021; H01M 10/4207; H01M 10/441; H01M 10/425; H01M 2220/20; H01M 2010/4278; Y02E 60/10; Y02T 10/70
See application file for complete search history.

(56) References Cited

U.S. PATENT DOCUMENTS

| | | | |
|---|---|---|---|
| 6,424,157 B1 * | 7/2002 | Gollomp | B60L 58/12 324/430 |
| 7,928,735 B2 * | 4/2011 | Huang | G01R 31/389 324/426 |

(Continued)

FOREIGN PATENT DOCUMENTS

| | | |
|---|---|---|
| JP | 2012029417 A | 2/2012 |
| JP | 2015184194 A | 10/2015 |

(Continued)

*Primary Examiner* — Akm Zakaria
(74) *Attorney, Agent, or Firm* — Mintz Levin Cohn Ferris Glovsky and Popeo, P.C.; Peter F. Corless

(57) ABSTRACT

A vehicle battery diagnosis method and apparatus are provided. The vehicle battery diagnosis method includes receiving battery state history data including data stored based on state of charge (SOC) ranges of a battery and SOCs of the battery. Maximum distributions of the SOCs of the battery are then determined based on the battery state history data. A state of the battery is diagnosed based on a reduction rate among the maximum distributions of the SOCs of the battery based on the battery state history data.

13 Claims, 5 Drawing Sheets

(51) Int. Cl.
*H02J 7/00* (2006.01)
*B60L 58/12* (2019.01)
*H01M 10/42* (2006.01)

(56) References Cited

U.S. PATENT DOCUMENTS

| | | | |
|---|---|---|---|
| 2012/0274331 A1* | 11/2012 | Liu | G01R 31/3835 |
| | | | 324/426 |
| 2013/0200902 A1* | 8/2013 | Kurimoto | B60L 58/21 |
| | | | 324/430 |
| 2013/0234672 A1 | 9/2013 | Kubota et al. | |
| 2013/0320989 A1 | 12/2013 | Inoue et al. | |
| 2017/0259687 A1* | 9/2017 | Chikkannanavar | B60L 58/12 |
| 2020/0072912 A1* | 3/2020 | Chun | G01R 31/52 |

FOREIGN PATENT DOCUMENTS

| | | |
|---|---|---|
| JP | 2017223454 A | 12/2017 |
| KR | 20100019249 A | 2/2010 |
| KR | 20160140439 A | 12/2016 |

\* cited by examiner

FIG. 3

| No | ITEM | Size | Logical Range | Logical Range | Resolution | Offset | Unit | |
|---|---|---|---|---|---|---|---|---|
| 1 | STORAGE INDEX | 1byte | 0~255 | 0~255 | 1 | 0 | Count | COUNT 1-24 |
| 2 | SOC OF 30% OR LESS | 2byte | 0~65535 | 0~65535 | 1 | 0 | min | |
| 3 | SOC OF 30~40% | 2byte | 0~65535 | 0~65535 | 1 | 0 | min | |
| 4 | SOC OF 40~50% | 2byte | 0~65535 | 0~65535 | 1 | 0 | min | |
| 5 | SOC OF 50~60% | 2byte | 0~65535 | 0~65535 | 1 | 0 | min | CONFIRM DISTRIBUTION ON MONTHLY BASIS |
| 6 | SOC OF 60~70% | 2byte | 0~65535 | 0~65535 | 1 | 0 | min | |
| 7 | SOC OF 70~80% | 2byte | 0~65535 | 0~65535 | 1 | 0 | min | |
| 8 | SOC OF 80~90% | 2byte | 0~65535 | 0~65535 | 1 | 0 | min | |
| 9 | SOC OF 90~100% | 2byte | 0~65535 | 0~65535 | 1 | 0 | min | |
| 10 | MINIMUM Ri VALUE | 1byte | 0~25.5mΩ | 0~255 | 1 | 0 | 0.1mΩ | ANALYZE INTERNAL RESISTANCE PATTERN |
| 11 | TOTAL CHARGING VALUE | 2byte | 0~65535Ah | 0~65535 | 1 | 0 | AH | ANALYZE ACCUMULATED CHARGING AMOUNT PATTERN |
| 12 | TOTAL DISCHARGING VALUE (LIN_On) | 2byte | 0~65535Ah | 0~65535 | 1 | 0 | AH | ANALYZE ACCUMULATED DISCHARGING AMOUNT PATTERN (LIN_On) |
| 13 | TOTAL DISCHARGING VALUE (LIN_Off) | 2byte | 0~65535Ah | 0~65535 | 1 | 0 | AH | ANALYZE ACCUMULATED DISCHARGING AMOUNT PATTERN (LIN_Off) |
| Total | | | (24 byte * 24ea) + 1 byte = 577 byte | | | | | |

FIG. 4A
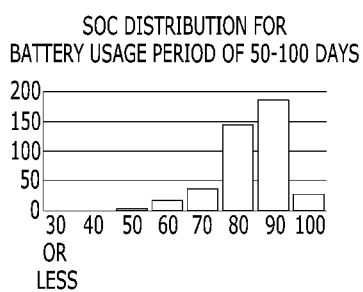
FIG. 4B
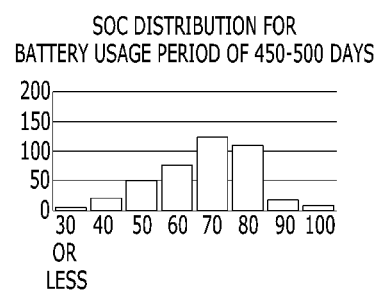
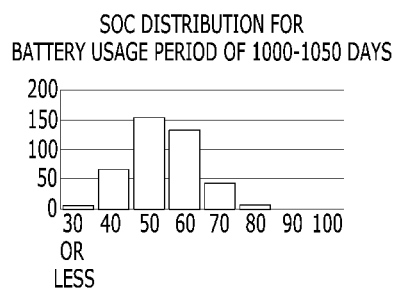
FIG. 4C

SOC DISTRIBUTION 6 MONTHS AGO

SOC DISTRIBUTION WITHIN LAST 1 MONTH

VEHICLE BATTERY DIAGNOSIS METHOD AND APPARATUS

CROSS-REFERENCE TO RELATED APPLICATION(S)

This application claims the benefit of Korean Patent Application No. 10-2018-0119835, filed on Oct. 8, 2018, which is hereby incorporated by reference as if fully set forth herein.

BACKGROUND

Field of the Invention

The present invention relates to a vehicle battery diagnosis method and apparatus, and more particularly, a method and apparatus that analyze an aging state of a battery in real time through state history and internal resistance of the battery using a battery sensor.

Discussion of the Related Art

In general, a conventional battery diagnosis apparatus diagnoses a state of a battery through a method of measuring a state of health (SOH) of the battery. For example, an internal resistance measurement method, a current measurement method and a voltage measurement method have been developed for diagnosing a battery state. A battery diagnosis method using measurement of internal resistance may be advantageous since a SOH of a battery is calculated using a resistance value and thus an exact value of the SOH may be acquired, but is disadvantageous in that measurement of internal resistance incurs costs and is influenced by temperature.

A battery diagnosis method using measurement of current may be advantageous in that implementation of a logic to diagnose a battery is simple, but is disadvantageous in that it takes a long time to diagnose the battery. A battery diagnosis method using measurement of voltage may be advantageous in that implementation of a logic to diagnose a battery is simple, but is disadvantageous in that accuracy in battery diagnosis is low.

Therefore, when the conventional battery diagnosis apparatuses diagnose batteries through measurement of internal resistance, current or voltage of the battery, the voltage measurement method may lower accuracy in battery diagnosis, the internal resistance measurement method may incur costs of equipment used to operate the battery diagnosis apparatus, and the current measurement method may cause incorrect diagnosis due to addition of a battery stabilization time to remove an error caused by a battery state.

SUMMARY

Accordingly, the present invention provides a vehicle battery diagnosis method and apparatus that substantially obviate one or more problems due to limitations and disadvantages of the related art. An object of the present invention is to provide a vehicle battery diagnosis method and apparatus which analyze an aging state of a battery in real time through state history and internal resistance of the battery using a battery sensor.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a vehicle battery diagnosis method may include receiving battery state history data including data stored according to state of charge (SOC) ranges of a battery and SOCs of the battery, determining maximum distributions of the SOCs of the battery based on the battery state history data, and diagnosing a state of the battery based on a reduction rate among the maximum distributions of the SOCs of the battery. The diagnosing of the state of the battery may include determining the state of the battery through a first logic based on data for a first period among the battery state history data, and determining the state of the battery through a second logic based on periodically stored data among the battery state history data, when the data for the first period data does not correspond to data processed by the first logic.

The determining of the state of the battery through the first logic may include determining whether a final SOC of the battery is less than a first SOC, determining whether a maximum SOC of the battery for a second period exceeds a second SOC, in response to determining that the final SOC of the battery is less than the first SOC, determining whether a minimum internal resistance value of the battery for the first period exceeds a predetermine value in response to determining that the maximum SOC of the battery for the second period exceeds the second SOC, and diagnosing that recharging of the battery is necessary, in response to determining that the minimum internal resistance value of the battery exceeds the predetermined value.

The determining of the state of the battery through the first logic may further include that exchange of the battery is necessary, in response to determining that the minimum internal resistance value of the battery does not exceed the predetermined value. The first SOC may have a value less than the second SOC. The first period may have value greater than the second period.

The diagnosing of the state of the battery through the second logic may include selecting maximum distribution ranges of the SOCs of the battery based on the periodically stored data, calculating a maximum distribution range change rate of the SOCs of the battery SOCs corresponding to a third period based on the selected maximum distribution ranges of the SOCs of the battery, determining whether a capacity reduction rate of the battery exceeds a predetermined value based on the calculated maximum distribution range change rate, determining whether an average of the SOCs of the battery within the first period is less than a third SOC, in response to determining that the capacity reduction rate of the battery exceeds the predetermined value, and diagnosing that exchange of the battery is necessary, in response to determining that the average of the SOCs of the battery within the first period is less than the third SOC.

The diagnosing the state of the battery through the second logic may further include diagnosing that the capacity of the battery is in a normal state and thus recharging of the battery is necessary, in response to determining that the average of the SOCs of the battery within the first period is not less than the third SOC. The third period may have a value greater than the first period.

In another aspect of the present invention, a vehicle battery diagnosis apparatus may include a receiver configured to receive battery state history data including data stored based on state of charge (SOC) ranges of a battery and SOCs of the battery, and a controller configured to determine maximum distributions of the SOCs of the battery based on the battery state history data and diagnose a state of the battery based on a reduction rate among the maximum distributions of the SOCs of the battery.

In particular, the controller may be configured to determine the state of the battery through a first logic based on data for a first period among the battery state history data, and determine the state of the battery through a second logic based on periodically stored data among the battery state history data, when the data for the first period does not correspond to data processed by the first logic. The controller, in response to the first logic, may be configured to determine whether a final SOC of the battery is less than a first SOC, determine whether a maximum SOC of the battery for a second period exceeds a second SOC, in response to determining that the final SOC of the battery is less than the first SOC, determine whether a minimum internal resistance value of the battery for the first period exceeds a predetermine value, in response to determining that the maximum SOC of the battery for the second period exceeds the second SOC, and diagnose that recharging of the battery is necessary, in response to determining that the minimum internal resistance value of the battery exceeds the predetermined value.

The controller may further be configured to diagnose that exchange of the battery is necessary, in response to determining that the minimum internal resistance value of the battery does not exceed the predetermined value. The first SOC may have a value less than the second SOC. The first period may have a value greater than the second period.

The controller, in response to the second logic, may be configured to select maximum distribution ranges of the SOCs of the battery based on the periodically stored data, calculate a maximum distribution range change rate of the SOCs of the battery corresponding to a third period based on the selected maximum distribution ranges of the SOCs of the battery, determine whether a capacity reduction rate of the battery exceeds a predetermined value based on the calculated maximum distribution range change rate, determine whether an average of the SOCs of the battery within the first period is less than a third SOC, in response to determining that the capacity reduction rate of the battery exceeds the predetermined value, and diagnose that exchange of the battery is necessary, in response to determining that the average of the SOCs of the battery within the first period is less than the third SOC.

The controller may also be configured to diagnose that the capacity of the battery is in a normal state and thus recharging of the battery is necessary, in response to determining that the average of the SOCs of the battery within the first period is not less than the third SOC. The third period may have a value greater than the first period.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate exemplary embodiment(s) of the invention and together with the description serve to explain the principle of the invention. In the drawings:

FIG. 3 is a view illustrating a structure of data stored in a battery sensor in accordance with one exemplary embodiment of the present invention;

FIGS. 4A to 4C are graphs illustrating maximum distribution prediction diagrams of battery SOCs in accordance with one exemplary embodiment of the present invention.

DETAILED DESCRIPTION

Figure 1:
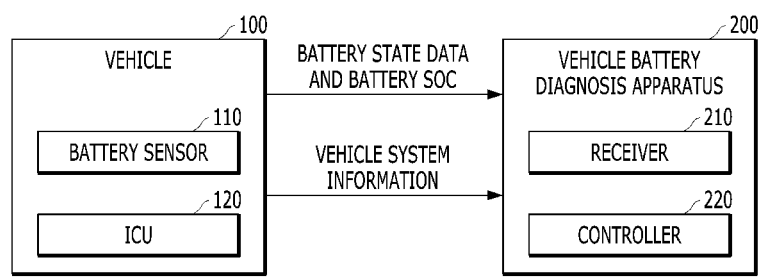
FIG. 1 is a block diagram illustrating a configuration of a system including a vehicle battery diagnosis apparatus in accordance with one exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Reference will now be made in detail to the exemplary embodiments of the present invention, examples of which are illustrated in the accompanying drawings. In the following description of the embodiments, it will be understood that, when positional relations are expressed, for example, when an element is "on or under" or "in front of or behind" another element, the two elements may directly contact each other, or one or more other elements may be interposed between the two elements. In addition, in the following description of the elements, when elements are described, the terms "first", "second", "A", "B", "(a)", "(b)", etc. may be used. It will be understood that these terms are used only to discriminate one element from other elements, and do not limit the nature, sequence or order of the corresponding element. In the following description of the embodiments, it will be understood that, when an element is "connected to", "coupled to" or "combined with" another element, the element may be directly connected or coupled to the other element, or one or more other elements may be interposed between the two elements.

All terms including technical or scientific terms have the same meanings as generally understood by those skilled in the art in which the present invention pertains, unless otherwise defined. In the following description of the embodiments, generally used terms, such as terms defined in dictionaries, will be interpreted as having meanings coinciding with contextual meanings in the related art, and are not be interpreted as having ideal or excessively formal meanings, unless clearly defined.

The present invention provides a vehicle battery diagnosis apparatus which reduces a time required to diagnose a battery and provides high accuracy in diagnosis through a vehicle battery diagnosis method which may immediately confirm an aging state of the battery using state history data of the battery without a separate stabilization time.

FIG. 1 is a block diagram illustrating a configuration of a system including a vehicle battery diagnosis apparatus in accordance with one exemplary embodiment of the present invention. Referring to FIG. 1, a vehicle 100 in accordance with the present invention may include a battery sensor 110 and an inverter-charger unit (ICU) 120.

The battery sensor 110 may be mounted within a vehicle battery and may be configured to measure voltage, current, internal resistance, SOC, etc. of the battery. The battery sensor 110 may be configured to store state history data of the battery in a memory unit (not shown). To store all data of the battery for a predetermined period, the battery state history data having a structure of periodically stored data may be stored in the memory unit. Accordingly, the battery sensor 110 may be configured to store data based on state of charge (SOC) ranges of the battery, etc., in the memory unit. The data structure will be described in detail in FIG. 3.

The battery sensor 110 may be configured to provide or transmit the battery state history data to the ICU 120. The ICU 120 may then be configured to provide or transmit battery SOCs and the battery state history data to a vehicle battery diagnosis apparatus 200. The vehicle battery diagnosis apparatus 200 in accordance with the present invention may include a receiver 210 and a controller 220. The receiver 210 may be configured to receive battery state history data and vehicle system information from the vehicle 100. The controller 220 may then be configured to analyze a state of the battery based on the battery state history data and the vehicle system information received by the receiver 210.

For example, the controller 220 may be configured to analyze a residual lifespan of the battery by analyzing battery usage data for a long term, based on properties that a distribution of SOCs of the battery is gradually reduced as wear of the battery proceeds. The controller 220 may be configured to receive the battery state history data and determine the state of the battery through a first logic. In particular, the first logic may include Operations S221-S227 shown in FIG. 2. The controller 220 may be configured to read data stored within a first period from the battery state history data received from the receiver 210. The data stored within the first period may be data stored within the last 30 days from the point of diagnosis of the battery.

Further, the controller 220 may be configured to determine whether a final SOC of the battery is less than a first SOC based on the read data. Hereinafter, the controller 220 may be configured to determine whether a maximum SOC of the battery corresponding to a second period exceeds a second SOC, when the final SOC of the battery is less than the first SOC. Particularly, the second period may have a value less than the first period. For example, the second period may be within the last 7 days from the point of diagnosis of the battery. Further, the first SOC may have a value less than the second SOC. For example, the first SOC may be a SOC of about 30% of the battery, and the second SOC may be a SOC of about 70% of the battery.

The controller 220 may be configured to determine whether a minimum internal resistance value of the battery corresponding to the first period exceeds a predetermined value, when the maximum SOC of the battery for the second period exceeds the second SOC. In particular, the minimum internal resistance value of the battery may be varied based on the type of battery. For example, the minimum internal resistance value of the battery may be about 40 mΩ. Therefore, the controller 220 may be configured to diagnose that recharging of the battery is necessary, when the minimum internal resistance value exceeds the predetermined value. The controller 220 may also be configured to diagnose that exchange of the battery is necessary, when the minimum internal resistance value does not exceed the predetermined value.

Additionally, the controller 220 may be configured to receive the battery state history data and determine the state of the battery through a second logic. Particularly, the second logic may include Operations S231-S237 shown in FIG. 2. The controller 220 may be configured to read data which is periodically stored, from the battery state history data. The controller 220 may then be configured to select maximum distribution ranges of battery SOCs which are periodically stored, from the read data. Thereafter, the controller 220 may be configured to calculate a maximum distribution range change rate of the battery SOCs corresponding to a third period. The third period may have a value greater than the first period. For example, the third period may be between a period of 6 months ago and a period within the last 1 month from the point of diagnosis of the battery.

Thereafter, the controller 220 may be configured to determine whether a capacity reduction rate of the battery exceeds a predetermined value based on the calculated change rate. For example, the capacity reduction rate of the battery may be about 20%. The controller 220 may be configured to determine whether an average of SOCs of the battery within the first period is less than a third SOC, when the capacity reduction rate of the battery exceeds the predetermined value. The controller 220 may be configured to determine whether the average of the SOCs of the battery within the last 30 days is less than the third SOC. For example, the third SOC may be a SOC of about 40% of the battery.

The controller 220 may be configured to diagnose that exchange of the battery is necessary, when the average of SOCs of the battery within the last 30 days is less than the third SOC. The controller 220 may be configured to determine that the capacity of the battery is normal when the average of the SOCs of the battery within the last 30 days is greater than the third SOC. The controller 220 may then be configured to diagnose that recharging of the battery is necessary, when the capacity of the battery is normal. Accordingly, the controller may be configured to recharge the battery.

Figure 2:
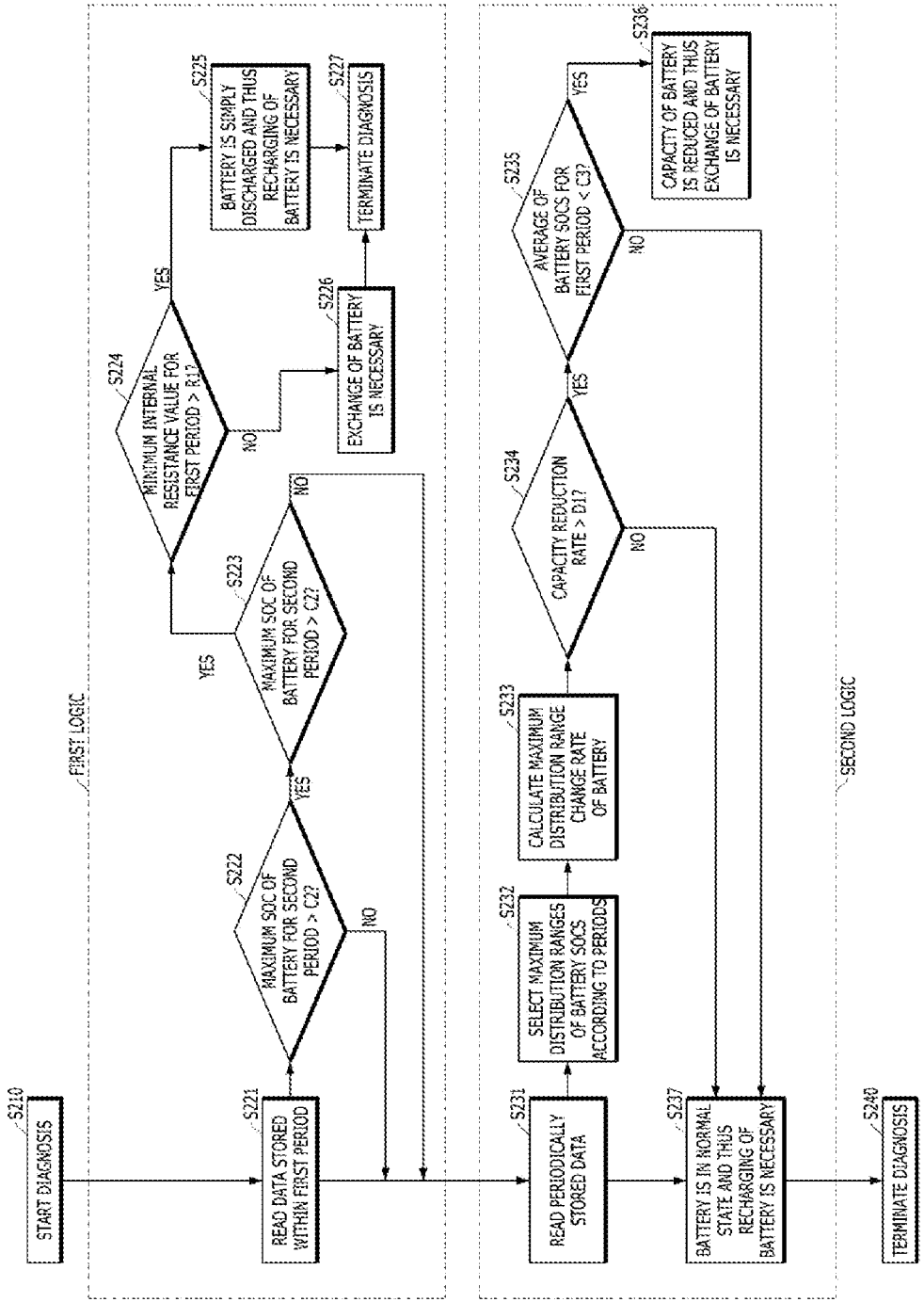
FIG. 2 is a flowchart illustrating a vehicle battery diagnosis method in accordance with one exemplary embodiment of the present invention.

FIG. 2 is a flowchart illustrating a vehicle battery diagnosis method in accordance with one exemplary embodiment of the present invention. Referring to FIG. 2, the controller 220 may be configured to start diagnosis of a battery of a vehicle based on battery SOCs and battery state history data received from the vehicle (Operation S210).

The controller 220 may then be configured to read data within a first period from the received battery SOCs and battery state history data (Operation S221). Thereafter, the controller 220 may be configured to read data stored according to predetermined periods, when the controller 220 may not read data within the first period. After Operation S221, the controller 220 may be configured to determine whether a final SOC of the battery is less than a first SOC C1 based on the read data (Operation S222). Thereafter, the controller 220 may be configured to read the data stored according to the predetermined periods, when the final SOC of the battery is greater than the first SOC C1.

After Operation S222, the controller may be configured to determine whether a maximum SOC of the battery within a second period exceeds a second SOC C2, when the final SOC of the battery is less than the first SOC C1 (Operation S223). Thereafter, the controller 220 may be configured to read the data stored according to the predetermined periods, when the maximum SOC of the battery within the second period does not exceed the second SOC C2. After Operation S223, the controller 220 may be configured to determine whether a minimum internal resistance value of the battery within the first period exceeds a predetermined value R1, when the maximum SOC of the battery within the second period exceeds the second SOC C2 (Operation S224).

After Operation S224, the controller 220 may be configured to diagnose that the battery is in a simply discharged state and thus recharging of the battery is necessary, when the minimum internal resistance value of the battery within the first period exceeds the predetermined value R1 (Operation S225). Accordingly, the controller 220 may be configured to recharge the battery. Further, after Operation S224, the controller 220 may be configured to diagnose that exchange of the battery is necessary, when the minimum internal resistance value of the battery is less than the predetermined value R1 (Operation S226).

After at least one of Operation S221, Operation S222 or Operation S223, the controller 220 may be configured to read the data stored according to the predetermined periods from the received battery SOCs and battery state history data (Operation S231). After Operation S231, the controller 220 may be configured to select maximum distribution ranges of the SOCs of the battery according to the periods (Operation S232). After Operation S232, the controller 220 may be configured to calculate a maximum distribution range change rate of the SOCs of the battery for the third period (Operation S233).

After Operation S233, the controller 220 may be configured to determine whether a capacity reduction rate of the battery exceeds a predetermined value D1 (Operation S234). Thereafter, the controller 220 may be configured to diagnose that recharging of the battery is necessary, when the capacity reduction rate of the battery is less than the predetermined value D1 and may be configured to charge the battery accordingly. After Operation S234, the controller 220 may be configured to determine whether an average of the SOCs of the battery within the first period is less than a third SOC C3, when the capacity reduction rate of the battery exceeds the predetermined value D1 (Operation S235). Thereafter, the controller 220 may be configured to diagnose that recharging of the battery is necessary, when the average of the SOCs of the battery within the first period is greater than the third SOC C3.

After Operation S235, the controller 220 may be configured to diagnose that the capacity of the battery is reduced and thus exchange of the battery is necessary, when the average of the SOCs of the battery within the first period is less than the third SOC C3 (Operation S236). After at least one of Operation S231, Operation S234 or Operation S235, the controller 220 may be configured to determine that the battery is in a normal state and thus recharging of the battery is necessary (Operation S237). Thereafter, the controller 220 may be configured to terminate diagnosis of the battery (Operation S240) and recharge the battery as necessary. A normal state does not require battery exchange.

FIG. 3 is a view illustrating a structure of data stored in the battery sensor in accordance with one exemplary embodiment of the present invention. The battery sensor 110 may be configured to store battery data to have a data structure having a minimized capacity and thus determine charging history behavior of the battery. Accordingly, the vehicle battery diagnosis apparatus may be configured to analyze a residual lifespan of the battery by analyzing the data stored in the battery sensor 110 for a long term, based on properties that a distribution of SOCs of the battery is gradually reduced as wear of the battery proceeds. The battery sensor 110 may thus be configured to store SOCs of the battery for 40 months, in consideration of a vehicle warranty period and a vehicle sales waiting period. In other words, the battery sensor 110 may be configured to store data over 40 months in 24 buffers on a 50-day basis according to the data structure.

With reference to FIG. 3, the data structure may have an item factor, a size factor, a logical range factor, a physical range factor, a resolution factor, an offset factor and a unit factor. The item factor may have a storage index item, a SOC item of about 30% or less, a SOC item of about 30%-40%, a SOC item of about 40%-50%, a SOC item of about 60%-70%, a SOC item of about 70%-80%, a SOC item of about 80%-90%, a SOC item of about 90%-100%, a minimum internal resistance (Ri) value item, a total charging value item, a total discharging value (LIN_On) item and a total discharging value (LIN_Off) item.

The storage index item may be data to count numbers 1 to 24. The storage index item may have a size of 1 byte, a logical range of 0-255, a physical range of 0-255, a resolution of 1, an offset of 0, and a unit of a count value. A plurality of the SOC items according to sections may be data to confirm an SOC distribution on a monthly basis. Each of the SOC items according to sections may have a size of 2 bytes, a logical range of 0-65535, a physical range of 0-65535, a resolution of 1, an offset of 0, and a unit of a minute.

The minimum internal resistance (Ri) value item may be data to analyze an internal resistance pattern. The minimum internal resistance (Ri) value item may have a size of 1 byte, a logical range of 0-25.5 mΩ, a physical range of 0-255, a resolution of 1, an offset of 0, and a unit of 0.1 mΩ. The total charging value item may be data to analyze an accumulated charging amount pattern.

The total discharging value (LIN_On) item may be data to analyze an accumulated discharging amount pattern (LIN_On). The total discharging value (LIN_Off) item may be data to analyze an accumulated discharging amount pattern (LIN_Off). In particular, each of the total charging value item, the total discharging value (LIN_On) item and the total discharging value (LIN_Off) item may have a size of 2 bytes, a logical range of 0-65535 Ah, a physical range of 0-65535, a resolution of 1, an offset of 0, and a unit of ampere-hour (Ah).

FIGS. 4A to 4C are graphs illustrating maximum distribution prediction diagrams of battery SOCs in accordance with one exemplary embodiment of the present invention. Referring to FIGS. 4A to 4C, the vehicle battery diagnosis apparatus may be configured to calculate a section having the maximum SOC distribution for a corresponding period by comparing the different sections. Accordingly, the vehicle battery diagnosis apparatus may be configured to generate distribution prediction diagrams of battery SOCs. The maximum distribution prediction diagrams of battery SOCs may be illustrated as graphs and, in the graphs, a horizontal axis represents SOC values according to sections and a vertical axis represents increase in time corresponding to the SOC values according to sections.

FIG. 4A is an SOC distribution graph for a battery usage period of 50-100 days. Referring to FIG. 4A, for the battery usage period of 50-100 days, a section having the maximum SOC distribution is a section having an SOC value of 90%. FIG. 4B is an SOC distribution graph for a battery usage period of 450-500 days. Referring to FIG. 4B, for the battery usage period of 450-500 days, a section having the maximum SOC distribution is a section having an SOC value of 70%.

Additionally, FIG. 4C is an SOC distribution graph for a battery usage period of 1,000-1,050 days. Referring to FIG. 4C, for the battery usage period of 1,000-1,050 days, a section having the maximum SOC distribution is a section having an SOC value of 50%. Therefore, the vehicle diagnosis apparatus may be configured to determine a state of change of the battery through the distribution prediction diagrams generated on a 50-day basis.

Figure 5A:
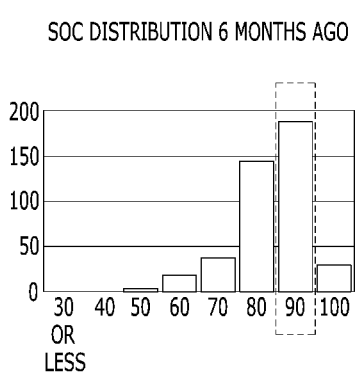
FIGS. 5A and 5B are graphs illustrating maximum distribution ranges of battery SOCs in accordance with one exemplary embodiment of the present invention.
Figure 5B:
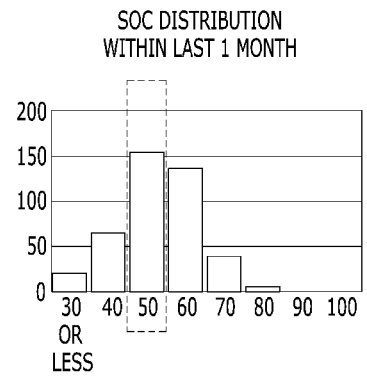

FIGS. 5A and 5B are graphs illustrating maximum distribution ranges of battery SOCs in accordance with one exemplary embodiment of the present invention. A maximum distribution prediction diagram of battery SOCs shown in FIG. 5A illustrates a maximum distribution range of battery SOCs of data 6 months ago from the point of diagnosis of the battery, and a maximum distribution prediction diagram of battery SOCs shown in FIG. 5B illustrates a maximum distribution range of battery SOCs of data within 1 month from the point of diagnosis of the battery.

Referring to FIGS. 5A and 5B, it may be understood that the maximum distribution range of battery SOCs of the data 6 months ago from the point of diagnosis of the battery is 90% and a maximum distribution range of battery SOCs of the data within 1 month from the point of diagnosis of the battery is 50%. Therefore, the vehicle battery diagnosis apparatus may be configured to determine that the SOC distribution of the battery is reduced by 40% and the capacity reduction rate of the battery exceeds 20%. Thereafter, the vehicle battery diagnosis apparatus may be configured to determine whether exchange or charging of the battery is necessary based on an average of the SOCs for the last 30 days.

The above-described method in accordance with the exemplary embodiment may be recorded as a program which may be implemented in computers, and be stored in a non-transitory computer readable recording medium and, for example, computer readable recording media may include a ROM, a RAM, a CD-ROM, a magnetic tape, a floppy disk, an optical data storage device, etc. The non-transitory computer readable recording media may be distributed to computer systems connected by a network and, herein, computer readable code may be stored and executed in a distributed manner. Further, functional programs, code and code segments to implement the above-described method may be easily deduced by programmers in the art to which the exemplary embodiments belong.

As is apparent from the above description, effects of a vehicle battery diagnosis method and apparatus in accordance with the present invention will be described below.

First, the vehicle condition monitoring and diagnosis method and system in accordance with the present invention may store battery state history data in a battery sensor and more accurately determine whether a current state of a battery is in a discharged state or an abnormal state, thus enhancing accuracy in battery diagnosis.

Second, the vehicle condition monitoring and diagnosis method and system in accordance with the present invention may allow a general vehicle diagnosis apparatus to implement vehicle battery diagnosis using the battery sensor mounted within a vehicle without additional hardware, thus reducing equipment investment costs.

It will be apparent to those skilled in the art that various modifications and variations may be made in the present invention without departing from the spirit or scope of the invention. Thus, it is intended that the present invention cover the modifications and variations of this invention provided they come within the scope of the appended claims and their equivalents.

What is claimed is:

1. A vehicle battery diagnosis method, comprising:
   receiving, by a controller, battery state history data comprising data stored according to state of charge (SOC) ranges of a battery and SOCs of the battery;
   determining, by the controller, maximum distributions of the SOCs of the battery based on the battery state history data; and
   diagnosing, by the controller, a state of the battery based on a capacity reduction rate among the maximum distributions of the SOCs of the battery in each time period,
   wherein the diagnosing of the state of the battery includes:
   determining, by the controller, the state of the battery through a first logic based on data for a first period among the battery state history data; and determining, by the controller, the state of the battery through a second logic based on periodically stored data among the battery state history data, when the data for the first period data does not correspond to data processed by the first logic, wherein the diagnosing the state of the battery through the second logic includes:

selecting, by the controller, maximum distribution ranges of the SOCs of the battery based on the periodically stored data;

calculating, by the controller, a maximum distribution range change rate of the SOCs of the battery SOCs corresponding to a third period according to the selected maximum distribution ranges of the SOCs of the batter;

determining, by the controller, whether a capacity reduction rate of the battery exceeds a predetermined value based on the calculated maximum distribution range change rate;

determining, by the controller, whether an average of the SOCs of the battery within the first period is less than a third SOC, in response to determining that the capacity reduction rate of the battery exceeds the predetermined value; and diagnosing, by the controller, that exchange of the battery is necessary, in response to determining that the average of the SOCs of the battery within the first period is less than the third SOC, and wherein the diagnosing of the state of the battery through the second logic further includes:

diagnosing, by the controller, that the capacity of the battery is in a normal state and recharging of the battery is necessary, in response to determining that the average of the SOCs of the battery within the first period is greater than the third SOC.

2. The vehicle battery diagnosis method according to claim 1, wherein the determining of the state of the battery through the first logic includes:

determining, by the controller, whether a final SOC of the battery is less than a first SOC;

determining, by the controller, whether a maximum SOC of the battery for a second period exceeds a second SOC, in response to determining that the final SOC of the battery is less than the first SOC;

determining, by the controller, whether a minimum internal resistance value of the battery for the first period exceeds a predetermine value, in response to determining that the maximum SOC of the battery for the second period exceeds the second SOC; and diagnosing, by the controller, that recharging of the battery is necessary, in response to determining that the minimum internal resistance value of the battery exceeds the predetermined value.

3. The vehicle battery diagnosis method according to claim 2, wherein the determining of the state of the battery through the first logic further includes:

diagnosing, by the controller, that exchange of the battery is necessary, in response to determining that the minimum internal resistance value of the battery is less than the predetermined value.

4. The vehicle battery diagnosis method according to claim 2, wherein the first SOC has a value less than the second SOC.

5. The vehicle battery diagnosis method according to claim 2, wherein the first period has a value greater than the second period.

6. The vehicle battery diagnosis method according to claim 1, wherein the third period has a value greater than the first period.

7. A non-transitory computer readable recording medium having a program recorded therein to implement the vehicle battery diagnosis method according to claim 1.

8. A vehicle battery diagnosis apparatus, comprising:

a receiver configured to receive battery state history data including data stored according to state of charge (SOC) ranges of a battery and SOCs of the battery; and a controller configured to determine maximum distributions of the SOCs of the battery based on the battery state history data and diagnose a state of the battery based on a capacity reduction rate among the maximum distributions of the SOCs of the battery in each time period, wherein the controller is configured to:

determine the state of the battery through a first logic based on data for a first period among the battery state history data; and determine the state of the battery through a second logic based on periodically stored data among the battery state history data, when the data for the first period does not correspond to data processed by the first logic, wherein the controller, in response to the second logic is configured to:

select maximum distribution ranges of the SOCs of the battery based on the periodically stored data;

calculate a maximum distribution range change rate of the SOCs of the battery corresponding to a third period based on the selected maximum distribution ranges of the SOCs of the battery;

determine whether a capacity reduction rate of the battery exceeds a predetermined value based on the calculated maximum distribution range change rate;

determine whether an average of the SOCs of the battery within the first period is less than a third SOC, in response to determining that the capacity reduction rate of the battery exceeds the predetermined value; and diagnose that exchange of the battery is necessary, in response to determining that the average of the SOCs of the battery within the first period is less than the third SOC, and wherein the controller is configured to diagnose that the capacity of the battery is in a normal state and recharging of the battery is necessary, in response to determining that the average of the SOCs of the battery within the first period is greater than the third SOC.

9. The vehicle battery diagnosis apparatus according to claim 8, wherein the controller, in response to the first logic is configured to:

determine whether a final SOC of the battery is less than a first SOC;

determine whether a maximum SOC of the battery for a second period exceeds a second SOC, in response to determining that the final SOC of the battery is less than the first SOC;

determine whether a minimum internal resistance value of the battery for the first period exceeds a predetermine value, in response to determining that the maximum SOC of the battery for the second period exceeds the second SOC; and diagnose that recharging of the battery is necessary, in response to determining that the minimum internal resistance value of the battery exceeds the predetermined value.

10. The vehicle battery diagnosis apparatus according to claim 9, wherein the controller is configured to diagnose that exchange of the battery is necessary, in response to determining that the minimum internal resistance value of the battery does not exceed the predetermined value.

11. The vehicle battery diagnosis apparatus according to claim 9, wherein the first SOC has a value less than the second SOC.

12. The vehicle battery diagnosis apparatus according to claim 9, wherein the first period has a value greater than the second period.

13. The vehicle battery diagnosis apparatus according to claim 8, wherein the third period has a value greater than the first period.

* * * * *